(12) United States Patent
Nordmann

(10) Patent No.: US 12,341,478 B2
(45) Date of Patent: Jun. 24, 2025

(54) IMPEDANCE MATCHING CIRCUIT AND PLASMA SUPPLY SYSTEM AND OPERATING METHOD

(71) Applicant: TRUMPF Huettinger GmbH + Co. KG, Freiburg (DE)

(72) Inventor: Birger Nordmann, Alfter (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 229 days.

(21) Appl. No.: 17/965,792

(22) Filed: Oct. 14, 2022

(65) Prior Publication Data

US 2023/0043171 A1 Feb. 9, 2023

Related U.S. Application Data

(63) Continuation of application No. PCT/EP2021/059449, filed on Apr. 12, 2021.

(30) Foreign Application Priority Data

Apr. 15, 2020 (DE) .......................... 202020102084.6

(51) Int. Cl.
*H03F 3/19* (2006.01)
*H01J 37/32* (2006.01)
*H03H 11/28* (2006.01)

(52) U.S. Cl.
CPC .......... *H03F 3/19* (2013.01); *H01J 37/32183* (2013.01); *H03H 11/28* (2013.01); *H01J 2237/332* (2013.01); *H01J 2237/334* (2013.01); *H05H 2242/26* (2021.05)

(58) Field of Classification Search
CPC .......... H01J 37/32183; H01J 37/32935; H01J 37/32174; H01J 2237/334; H01J 37/32082; H01J 37/3299; H01J 2237/332; H01J 37/32146; H01J 37/32091; H01J 37/32165; H01J 65/048
See application file for complete search history.

(56) References Cited

U.S. PATENT DOCUMENTS

| 5,473,291 | A | 12/1995 | Brounley |
| 5,654,679 | A | 8/1997 | Mavretic et al. |
| 6,424,232 | B1 | 7/2002 | Mavretic et al. |
| 6,677,828 | B1 | 1/2004 | Harnett et al. |
| 7,153,387 | B1 | 12/2006 | Tomoyasu |
| 7,180,758 | B2 | 2/2007 | Lincoln et al. |

(Continued)

FOREIGN PATENT DOCUMENTS

| CN | 202978850 U | 6/2013 |
| DE | 102009001355 A1 | 9/2010 |

(Continued)

*Primary Examiner* — Wei (Victor) Y Chan
(74) *Attorney, Agent, or Firm* — Leydig, Voit & Mayer, Ltd.

(57) ABSTRACT

An impedance matching circuit includes a radiofrequency terminal and a series circuit connected to the radiofrequency terminal, wherein the series circuit comprises at least one reactance and at least one switching element having a drive input. A drive circuit is connected to the drive input and a coupler is connected to the drive circuit so as to an enable signal input. The impedance matching circuit enables short switching times and low losses in the at least one switching element.

23 Claims, 2 Drawing Sheets

(56) References Cited

U.S. PATENT DOCUMENTS

| | | | |
|---|---|---|---|
| 7,190,229 B1* | 3/2007 | Lautzenhiser | H03F 3/211 |
| | | | 330/124 R |
| 7,251,121 B2 | 7/2007 | Bhutta | |
| 7,498,908 B2 | 3/2009 | Gurov | |
| 7,605,673 B2 | 10/2009 | Robotham, Jr. | |
| 8,416,008 B2 | 4/2013 | Van Zyl et al. | |
| 8,436,643 B2 | 5/2013 | Mason | |
| 9,306,533 B1 | 4/2016 | Mavretic | |
| 9,490,353 B2 | 11/2016 | Van Zyl et al. | |
| 9,525,412 B2 | 12/2016 | Mavretic | |
| 9,660,613 B2 | 5/2017 | Van Zyl et al. | |
| 9,715,996 B2 | 7/2017 | Son | |
| 10,229,816 B2 | 3/2019 | Coumou et al. | |
| 10,269,540 B1 | 4/2019 | Carter et al. | |
| 10,931,246 B2* | 2/2021 | Seshita | H03F 3/245 |
| 11,387,786 B2* | 7/2022 | Kawano | H03F 3/604 |
| 11,476,849 B2* | 10/2022 | Shanjani | H03K 17/6872 |
| 2008/0061901 A1 | 3/2008 | Gilmore | |
| 2010/0225411 A1 | 9/2010 | Maier | |
| 2017/0345620 A1* | 11/2017 | Coumou | H03F 1/3223 |
| 2018/0041183 A1 | 2/2018 | Mavretic et al. | |
| 2018/0247795 A1 | 8/2018 | Maier et al. | |
| 2019/0108976 A1* | 4/2019 | Van Zyl | H01J 37/32146 |
| 2019/0180982 A1* | 6/2019 | Brouk | H01J 37/32009 |
| 2019/0214232 A1 | 7/2019 | Morii et al. | |
| 2021/0351007 A1* | 11/2021 | Carter | H01J 37/32422 |
| 2021/0386294 A1* | 12/2021 | Oliveti | A61B 18/22 |
| 2023/0104189 A1* | 4/2023 | He | H03F 1/565 |
| | | | 330/297 |
| 2023/0317413 A1* | 10/2023 | Oliveti | H01J 37/32183 |
| | | | 315/111.21 |
| 2024/0007059 A1* | 1/2024 | Ayranci | H03F 3/195 |

FOREIGN PATENT DOCUMENTS

| | | |
|---|---|---|
| DE | 102011007598 A1 | 10/2012 |
| DE | 102015220847 A1 | 4/2017 |
| DE | 202017105350 U1 | 11/2018 |
| DE | 202020103539 U1 | 6/2020 |
| JP | 2003258605 A | 9/2003 |
| JP | 2017069823 A | 4/2017 |
| KR | 1020130058837 B1 | 6/2013 |
| WO | WO 2010141774 A2 | 12/2010 |
| WO | WO 2017204889 A1 | 11/2017 |
| WO | WO 2019140235 A1 | 7/2019 |

\* cited by examiner

IMPEDANCE MATCHING CIRCUIT AND PLASMA SUPPLY SYSTEM AND OPERATING METHOD

CROSS REFERENCE TO RELATED APPLICATIONS

This application is a continuation of International Application No. PCT/EP2021/059449 (WO 2021/209390 A1), filed on Apr. 12, 2021, and claims benefit to German Patent Application No. DE 20 2020 102 084.6, filed on Apr. 15, 2020. The aforementioned applications are hereby incorporated by reference herein.

FIELD

The invention relates to an impedance matching circuit comprising a series circuit connected to a radiofrequency terminal (RF terminal), wherein the series circuit comprises at least one reactance, in particular capacitance, and at least one switching element having a drive input, to which a drive circuit is connected.

BACKGROUND

The invention also comprises a plasma supply system having such an impedance matching circuit.

The invention also comprises a method for operating a previously described impedance matching circuit, in particular in a previously described plasma supply system.

Here, radiofrequency (RF) means a frequency of 1 MHz or more. In particular, a frequency of 10 MHz or more is meant thereby.

A reactance may be an inductance or a capacitance or a combination of the two.

Such impedance matching circuits are often used in RF-excited plasma processes. RE-excited plasma processes are used, for example, for coating (sputtering) and/or etching substrates during the manufacture of architectural glass, semiconductors, photovoltaic elements, flatscreens, displays, etc. The impedances in such processes often change very quickly, for which reason the impedance matching should often be adapted very quickly (within a few ms or less) The powers of such processes are a few 100 W (for example 300 W or higher), but quite often also a few kW or a few 10 kW. In the case of such powers, the voltage within the impedance matching circuits is often several 100 V (for example 300 V or more), quite often also 1000 V or more. The currents in such circuits can be a few amperes, often a few 10 A, including also 100 A or more. Realizing impedance matching circuits in the case of such voltages and currents has already always represented a considerable challenge. The rapid changeability of reactances in such impedance matching circuits represents an additional very significant challenge.

Such an impedance matching circuit has been disclosed, for example, in DE 10 2015 220 847 A1 and has been referred to therein as impedance matching network. The reactances 18, 20, 22 disclosed therein are variably adjustable in order to be able to set the impedance matching. One possible way of achieving the variable adjustment consists in connecting and disconnecting reactances of different values by means of electronically driven semiconductor switches. Reference will be made to the disclosure of DE 10 2015 220 847 A1 and this will be incorporated in the subject matter of the present disclosure.

In the case of such impedance matching circuits, there is the requirement to connect a reactance, in particular capacitance, in a switched impedance matching circuit dynamically into an RF path. This should take place as quickly as possible. However, increased losses in the switching element occur during the switching process, and these switching losses can result in the additional thermal loading and destruction of the switching element. A short switching time needs to be achieved in order to minimize the losses and the risk of destruction.

SUMMARY

In an embodiment, the present disclosure provides an impedance matching circuit includes a radiofrequency terminal and a series circuit connected to the radiofrequency terminal, wherein the series circuit comprises at least one reactance and at least one switching element having a drive input. A drive circuit is connected to the drive input and a coupler is connected to the drive circuit so as to an enable signal input.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
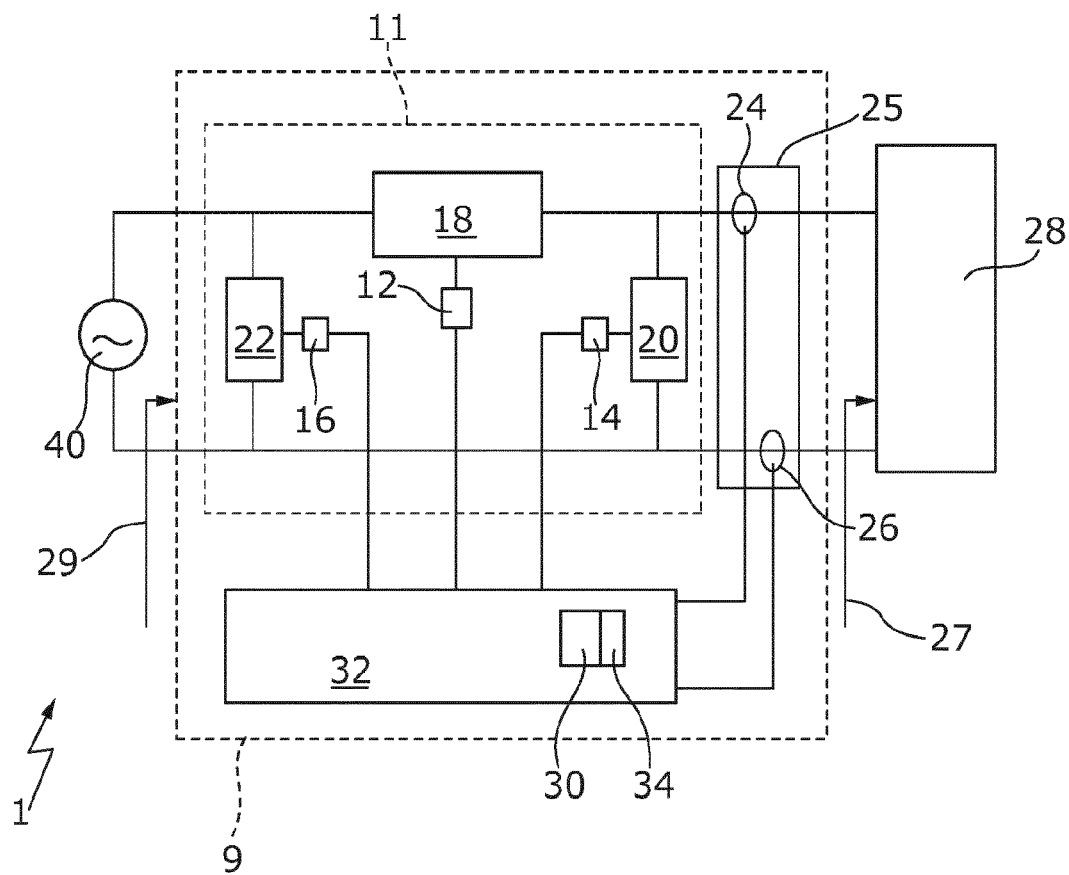
FIG. 1 shows a plasma supply system comprising an impedance matching circuit.

An aspect of the present invention includes an impedance matching circuit to reduce problems during connection of a reactance, in particular capacitance, are reduced.

In an aspect, the present invention provides by an impedance matching circuit comprising a series circuit connected to a radiofrequency terminal, wherein the series circuit comprises at least one reactance, in particular capacitance, and at least one switching element having a drive input, to which a drive circuit is connected, wherein the drive circuit is connected to an enable signal input via a coupler. Thus, short switching times with low losses in the switching element(s) can be achieved. The drive circuit is preferably designed to be able to drive the drive input of the at least one switching element in such a way that the state of the at least one switching element can be changed, in particular switched on and off. A coupler is used for transmitting an electrical signal or an item of signal information between two isolated electrical potentials, in particular between two DC-isolated potentials. Therefore, different electrical potentials can be present at the input and output of the coupler. The coupler is used in particular for transmitting items of switching information to the drive circuit. Within the meaning of the present invention, an enable signal input is a signal input via which the state of the at least one switching element can be changed, in particular switched on and off.

The coupler can be in the form of, for example, an optocoupler, magnetic coupler, electromechanical or electrical coupler. A magnetic coupler is also referred to as an inductive coupler. The coupling takes place by means of changing magnetic fields. It is possible, for example, for a one-to-one transformer or a transformer to be constructed with or without ferrites as inductance-increasing elements. An electrical coupler is also referred to as a capacitive coupler. The coupling takes place by means of electrical fields. A typical example of an electrical coupler is an electrical capacitor. An electromechanical coupler can be in the form of, for example, a relay or a piezo-based coupler.

The electrical coupler can be configured to bypass a high voltage, which, with respect to ground, is greater than an RF voltage occurring in the impedance matching circuit, in particular is greater than an RF voltage occurring in the series circuit, in particular is greater than an RF voltage occurring at the at least one reactance, in particular capacitance, and/or at the at least one switching element. In particular, the high voltage can be 300 V or more, in particular also 1000 V or more.

The electrical coupler can be configured to decouple a radiofrequency (RF) which corresponds to the radiofrequency applied to the impedance matching circuit during operation at the radiofrequency terminal. In particular, the RF can be 1 MHz or more, in particular 10 MHz or more.

The impedance matching circuit can be configured, during operation, i.e. when there is an RF voltage applied at the RIF terminal, to switch the switching element(s) on and off and, in particular when there is an RF current flowing through the switching element(s), to switch said switching element(s) off. The RF current can in this case in the flowing state be 1 A or higher, in particular 10 A or higher, preferably 100 A or higher.

Particular advantages result when the drive circuit is integrated in the coupler. As a result, a space-saving arrangement can be achieved.

The coupler can be constructed from discrete components. For example, it can be in the form of optical waveguides in combination with an optocoupler, in the form of transformers, one-to-one transformers, capacitors, in the form of a combination of individual components or in the form of a module which combines a plurality of properties, for example in the form of a one-to-one transformer having magnetic and capacitive coupling.

Alternatively, the coupler can be in the form of an integrated circuit. In particular, the coupler can be formed in a digital coupler circuit.

The drive circuit can be constructed from discrete components. Alternatively, it can be in the form of an integrated circuit.

The series circuit can have two transistors, in particular field-effect transistors, connected back-to-back in series, which are connected at their source terminals in the case of field-effect transistors or emitters in the case of bipolar transistors and are at a common source potential or emitter potential. A drive circuit which is at the common source potential or emitter potential and which also oscillates at the frequency of the signal to be transmitted by the impedance matching circuit enables quick charge reversal of the gate-source capacitance or base-emitter capacitance.

The drive circuit can be connected to a supply voltage via at least one inductor. As a result, decoupling of the drive circuit can take place. Preferably, two inductors are provided. In particular, in each case one inductor is provided between a terminal of the supply voltage and a terminal of the drive circuit. The inductors are configured to provide a mean supply current of the drive circuit and possibly of the coupler. The inductors are configured not to transmit any quick switching edges. Quick switching edges are intended to mean edge durations (10% to 90%) of 1 ms or less, in particular of 100 µs is or less, preferably of 10 µs or less. The inductors can have in particular the same inductance.

The drive circuit can be connected, in particular directly, to the source potential or emitter potential. In particular, the drive circuit can be connected to a terminal point of the series circuit, in particular to a source terminal, in particular to the source potential, via a referencing circuit. The referencing circuit can be configured and in particular also used to reference the supply voltage in bipolar fashion with respect to the source potential. It is therefore not necessary to supply a negative supply voltage to the drive circuit via a further inductor. The referencing circuit can also oscillate at the frequency of the signal to be transmitted. A bipolar supply voltage is helpful for quick charge reversal of the gate-source capacitance. Furthermore, radiofrequency signals coupling onto the gate-source voltages can be compensated for.

The terminal point can be connected directly to the referencing circuit. The referencing circuit can thus also oscillate at the frequency of the signal to be transmitted particularly well.

The referencing circuit can have a voltage divider. The decoupled supply voltage can be referenced thereby. The voltage divider can in particular have two series-connected resistors. The resistors can in particular have the same value.

The node between the two series-connected resistors can be connected, in particular directly connected, to the source potential.

The referencing circuit can have one, in particular two, internal DC voltage source(s), wherein the internal DC voltage source(s) has/have in particular in each case one capacitor. In particular, the internal DC voltage source(s) can consist of in each case one capacitance. Each capacitance can be formed from one or more capacitors.

The two internal DC voltage sources can be connected in series and in particular have the same voltage.

The common node between the two series-connected internal DC voltage sources can be connected, in particular directly connected, to the source potential.

The common node between the two series-connected internal DC voltage sources can be connected to the voltage divider, in particular at the node between the two resistors of the voltage divider. Thus, the voltage of the two voltage sources can be kept constant.

The referencing circuit can be connected to a supply voltage via at least one inductor. The inductance of the inductor(s) can be dimensioned in such a way that the RF current which flows from the drive circuit or the referencing circuit to the supply voltage is negligibly low.

The supply voltage can keep the voltage source(s) at a fixed potential, which is set correspondingly for switching the transistors.

The series circuit can have a switching transistor having a source potential connected to ground.

The series circuit can have at least two switching elements connected in parallel. The current-carrying capacity can be increased thereby.

The impedance matching circuit can have a plurality of series circuits connected in parallel, each having a drive circuit connected thereto.

Reactances, in particular capacitances, provided in the series circuits can have different values.

The object is also achieved by a plasma supply system comprising a radiofrequency power generator, a load in the form of a plasma process operated at RF for coating or etching a substrate, and a previously described impedance matching circuit.

The object is also achieved by a plasma supply system comprising a radiofrequency power generator, a load in the form of a plasma process operated at RF for coating or etching a substrate, and an impedance matching arrangement, which has a plurality of the previously described impedance matching circuits.

The object is also achieved by a method for operating a previously described impedance matching circuit, in particular in a previously described plasma supply system, comprising one or more of the following method steps:
a) switching on the switching element or the switching elements, in particular by means of a sufficiently high positive voltage between the gate terminal and a source terminal or gate terminals and source terminals,
b) switching off the switching element or the switching elements, in particular by means of a sufficiently negative voltage between the gate terminal and a source terminal or gate terminals and source terminals,
c) connecting a high voltage to the drain terminal of the switching element or the drain terminals of the switching elements, wherein the high voltage is greater in terms of absolute value than the greatest, in terms of absolute value, voltage between the drain terminal and the source terminal,
d) disconnecting a high voltage from the drain terminal of the switching element or from the drain terminals of the switching elements.

The abovementioned method steps b) and c) can preferably take place simultaneously.

The abovementioned method steps a) and d) can preferably take place simultaneously.

Further advantages of the invention can be gleaned from the description and the drawings. Likewise, the abovementioned features and the features yet to be listed below can be used in accordance with the invention in each case individually or two or more can be used together in any desired combinations. The embodiments shown and described should not be understood as a finite list, but rather have an exemplary character for the description of the invention.

FIG. 1 shows a plasma supply system 1 comprising a radiofrequency power generator 40, which is connected to a load 28, in particular a plasma load, via an impedance matching circuit 11. The impedance matching circuit 11 is a component part of an impedance matching arrangement 9. In the exemplary embodiment shown, the impedance matching circuit 11 comprises reactances 18, 20, 22, which are each driven via a drive circuit 12, 14, 16 in order to change their reactance value. The drive circuits 12, 14, 16 are driven by a controller 32. Via a measuring device 25, which can have measuring elements 24, 26, for example for detecting current and voltage, forward power and reflected power and/or absolute impedance value and phase angle, is connected to the controller 32. On the basis of the variables determined by the measuring device 25, for example, a power reflected at the load 28 or a reflection coefficient can be determined. A reflected power occurs when there is a mismatch, i.e. when the impedance of the load 28 is not matched to the output impedance of the power generator 40. As an alternative or in addition, a corresponding measuring device can also be arranged at the input or within the impedance matching arrangement 9. The impedance matching arrangement 10 is suitable for converting the load impedance 27 at the input of the load 28 into a transformed load impedance 29 at the input of the impedance matching circuit 10, i.e. on the generator side.

Figure 2:
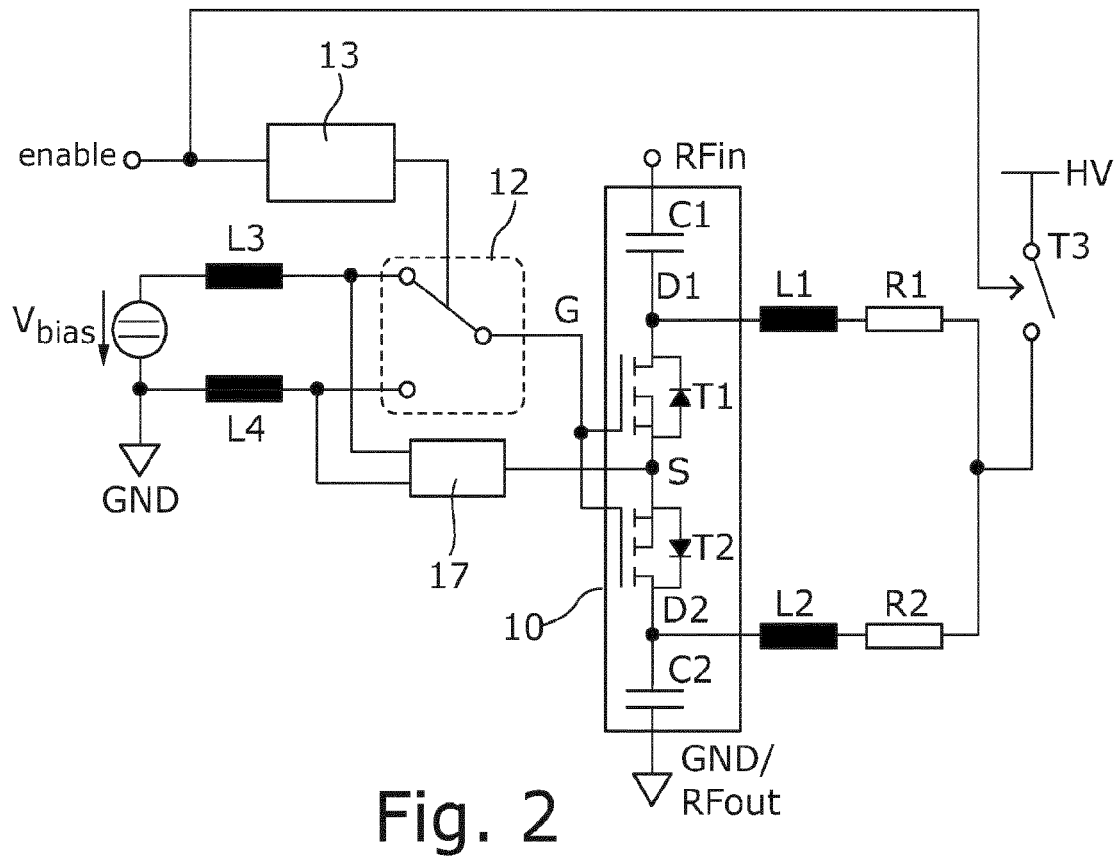
FIG. 2 shows part of an impedance matching circuit.

FIG. 2 shows part of the impedance matching circuit 11. A series circuit 10 in this case comprises two switching elements T1, T2, which are in the form of field-effect transistors. The switching elements T1, T2 are connected to one another at their source terminals 5, i.e. connected back-to-back in series. Furthermore, the series circuit 10 in this case comprises the capacitances C1, C2. In a more general form, a series circuit 10 comprises at least one reactance, in particular capacitance C1, C2, and at least one switching element T1, T2. Such a series circuit 10 can be a part of one of the reactances 18, 20, 22 in FIG. 1. Reactances can be inductances or capacitances C1, C2. In particular, a variable reactance 18, 20, 22 can have a plurality of series circuits connected in parallel which are constructed in the same way as the previously described series circuit 10.

The arrangement shown in FIG. 2 is suitable for connecting a capacitance C1, C2 dynamically into an RF path. The terminal to the RF path is denoted by RFin and corresponds to the terminal to the power generator 40.

The operation of the circuit in FIG. 2 can be described as follows: When the capacitances C1, C2 in the impedance matching circuit 10 are intended to be connected, the switching elements T1, T2 are switched on, i.e. switched so as to be conducting. This can take place in the present case by means of a sufficiently high positive voltage between the two gate terminals G and the two source terminals S.

When the capacitances C1, C2 in the impedance matching circuit 10 are intended to be disconnected, the switching elements T1, T2 are switched off, i.e. switched so as to be nonconducting. This can take place in the present case by means of a sufficiently negative voltage between the two gate terminals G and the two source terminals S. In the switched-off state, in the case of certain configurations of the switching elements T1, T2, namely in the case of conventional MOSFETs, the voltage between the source terminals S and the drain terminals D1, D2 of the switching elements T1, T2 must not become positive since otherwise the switching elements T1, T2 could become conducting via internal parasitic diodes, and the switching elements T1, T2 could be destroyed. Since, however, at the switching elements T1, T2 in the nonconducting state an RF voltage is present across the terminal RFin and RFout, respectively, which can become very high, to be precise either positive or negative, this requirement should be ensured by external circuitry. The external circuitry can in this case take place by means of the connection of a high voltage HV. This high voltage HV can be a DC voltage. This high voltage HV should be higher in terms of absolute value than the maximum negative voltage which occurs at one of the drain terminals D1, D2. This high voltage HV can be connected via a further switching element T3, i.e. the further switching element T3 is switched on, i.e. switched so as to be conducting, during operation when the drive circuit 12 switches off the switching elements T1, T2, i.e. switches them so as to be nonconducting.

The further switching element T3 and the high voltage HV can be protected from radiofrequency via an RF-filtering arrangement, in particular an RL element. In this case, the RL element has in each case one resistor R1, R2 and in each case one inductance L1, L2, which are connected in series, respectively.

When the switching elements are switched on, i.e. switched so as to be conducting, again, the high voltage HV should be disconnected from the switching elements T1, T2, i.e. the further switching element T3 should be switched off, i.e. switched so as to be nonconducting, in order to then not subject the series circuit 10 to a load by virtue of the high voltage.

The arrangement in FIG. 2 can be realized on a printed circuit board (PCB).

The switching elements T1, T2 are driven by a drive circuit 12 at their gate terminals G. Said drive circuit 12 receives a switching signal from a coupler 13, which is connected to an enable signal input (enable). During the switching process, increased losses occur in the switching elements T1, T2, which can lead to the increased thermal loading and destruction of the switching elements T1, T2. A short switching time needs to be achieved in order to minimize the losses and the risk of destruction.

The switching elements T1, T2 are at a common source potential. A drive circuit 12, which is at the common source potential and also oscillates at the frequency of the radiofrequency signal generated by the power generator 40, enables quick charge reversal of the gate-source capacitances of the switching elements T1, T2.

The drive circuits 12, 14, 16 can be designed to be identical. The coupler 13 can be integrated in the drive circuits 12, 14, 16 or implemented in the controller 32. The coupler 13 can be constructed from discrete components. The coupler 13 can be embodied as an optocoupler, magnetic coupler, electrical coupler, electromechanical coupler or any desired arrangement for data transmission, in particular as a digital coupler, in particular as an integrated circuit. The drive circuit 12 can be embodied from discrete components or in such a way as to be integrated with the coupler 13.

The supply voltage Vbias is provided to the drive circuit 12 via RF inductors L3, L4. The drive circuit 12 is decoupled by virtue of the inductors L3, L4. The inductors L3, L4 provide only the mean supply current of the drive circuit 12 and possibly of the coupler 13. Quick switching edges no longer need to be transmitted via the inductors L3, L4. In order that the voltage at the supply input of the drive circuit 12 does not dip, for example in the case of switching edges, in addition a referencing circuit 17 can be provided at the supply input of the drive circuit 12. Said referencing circuit 17 is firstly configured to stabilize the voltage at the input of the drive circuit 12. A further function of the referencing circuit 17 is described in connection with FIG. 3.

The potential denoted by GND/RFout in FIG. 2 can be used as RF output. The capacitance C2 can be replaced by a further switching transistor having a source potential connected to GND.

Figure 3:
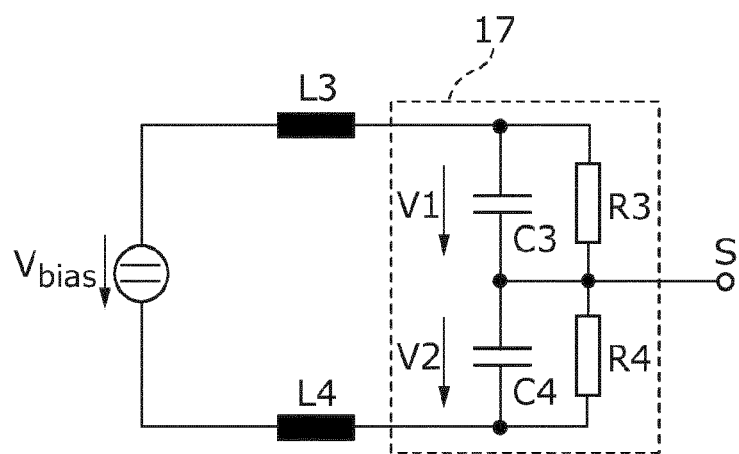
FIG. 3 shows a referencing circuit.

A referencing circuit 17, which is illustrated in detail in FIG. 3, can be configured and in particular also used to reference the supply voltage Vbias in bipolar fashion with respect to the source potential. It is therefore not necessary to supply a negative supply voltage, via a further inductor, to the drive circuit 12. The referencing circuit 17 can be connected to a potential of the series circuit, in particular to the source terminals S. Then, said referencing circuit 17 likewise oscillates at the frequency of the signal generated by the power generator 40. Such a bipolar supply voltage is helpful for the quick charge reversal of the gate-source capacitance. Furthermore, RF signals coupling onto the gate-source voltages can be compensated for. The referencing circuit 17 does not necessarily need to generate a bipolar voltage. The connection of the potential connected to GND via the inductor L4 to the source potential (S) is likewise possible.

FIG. 3 shows the referencing circuit 17. Said referencing circuit 17 comprises the resistors R3, R4 and the capacitances C3, C4. The referencing circuit 17 has a voltage divider R3, R4 and two internal DC voltage sources V1, V2, wherein the internal DC voltage sources each have a capacitor C3, C4.

The two resistors R3, R4 are connected in series.

The common node between the two series-connected two resistors R3, R4 is connected to the source terminals S.

The common node between the two series-connected two resistors R3, R4 is in particular also connected to the common node between the two series-connected internal DC voltage sources V1, V2.

The two internal DC voltage sources V1, V2 are connected in series. Each DC voltage source V1, V2 consists in each case of a capacitance C3, C4. Each capacitance C3, C4 can be embodied from one or more capacitors.

The common node between the two series-connected internal DC voltage sources V1, V2 is connected to the source terminals S.

The supply voltage Vbias can be in the form of a current supply with a fixed output voltage which charges the two capacitances C3, C4 via the inductors L3, L4, i.e. subsequently supplies the charge with a current filtered by the inductors L3, L4 which is used by the drive circuit 12 for driving the series circuit 10.

Such an impedance matching circuit 11 has also been disclosed, for example, in DE 20 2020 103 539 U1 and has been referred to therein as impedance matching arrangement 11. The reactances 18, 20, 22 disclosed therein are likewise variably adjustable in order to be able to set the impedance matching. One possible way of achieving the variable adjustment consists in connecting and disconnecting reactances of different values by means of electronically driven semiconductor switches. Reference is also made to the disclosure of DE 20 2020 103 539 U1 and the latter is incorporated in the subject matter of the present disclosure. In particular, the series circuit 10 described herein can be configured as a circuit arrangement 116 described therein.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including

The invention claimed is:

1. An impedance matching circuit-comprising:
   a radiofrequency terminal;
   a series circuit connected to the radiofrequency terminal, wherein the series circuit comprises at least one reactance and at least one switching element having a drive input;
   a drive circuit connected to the drive input; and
   a coupler connected to the drive circuit so as to enable a signal input,
   wherein the coupler is configured to bypass a high voltage with respect to ground greater than an RF voltage occurring in the impedance matching circuit, or
   wherein the coupler is configured to decouple a radiofrequency applied to the impedance matching circuit during operation at the radiofrequency terminal.

2. The impedance matching circuit as claimed in claim 1, wherein the coupler comprises an optocoupler, a magnetic coupler, an electromechanical coupler or an electrical coupler.

3. An impedance matching circuit comprising:
   a radiofrequency terminal:
   a series circuit connected to the radiofrequency terminal, wherein the series circuit comprises at least one reactance and at least one switching element having a drive input:
   a drive circuit connected to the drive input; and
   a coupler connected to the drive circuit so as to enable signal input,
   wherein the impedance matching circuit is configured, when there is a voltage applied at the radiofrequency terminal, to switch the at least one switching element on and off.

4. The impedance matching circuit as claimed in claim 1, wherein the drive circuit and the coupler are integrated in a single unit.

5. The impedance matching circuit as claimed in claim 1, wherein the coupler is constructed from discrete components.

6. The impedance matching circuit as claimed in claim 1, wherein the coupler is in the form of an integrated circuit.

7. The impedance matching circuit as claimed in claim 1, wherein the drive circuit is constructed from discrete components.

8. The impedance matching circuit as claimed in claim 1, wherein the drive circuit is in the form of an integrated circuit.

9. The impedance matching circuit as claimed in claim 1, wherein the series circuit comprises two transistors connected back-to-back in parallel, and wherein the two transistors are connected at source terminals thereof and are at a common source potential.

10. The impedance matching circuit as claimed in claim 1, wherein the drive circuit is connected to a supply voltage via at least one inductor.

11. The impedance matching circuit as claimed in claim 9, wherein the drive circuit is connected to the source potential.

12. The impedance matching circuit as claimed in claim 1, further comprising a referencing circuit, wherein the drive circuit is connected to a terminal point of the series circuit via the referencing circuit.

13. The impedance matching circuit as claimed in claim 12, wherein the terminal point is connected directly to the referencing circuit.

14. An impedance matching circuit comprising:
   a radiofrequency terminal;
   a series circuit connected to the radiofrequency terminal, wherein the series circuit comprises at least one reactance and at least one switching element having a drive input;
   a drive circuit connected to the drive input;
   a coupler connected to the drive circuit so as to enable signal input; and
   a referencing circuit, wherein the drive circuit is connected to a terminal point of the series circuit via the referencing circuit,
   wherein the referencing circuit has a voltage divider, or
   wherein the referencing circuit has at least one internal DC voltage source each having one capacitor.

15. The impedance matching circuit as claimed in claim 14, wherein the at least on internal DC voltage includes two internal DC voltage sources connected in series and having the same voltage.

16. The impedance matching circuit as claimed in claim 15, wherein a common node between the two series-connected internal DC voltage sources is connected to the source potential.

17. The impedance matching circuit as claimed in claim 12, wherein the referencing circuit is connected to a supply voltage via at least one inductor.

18. The impedance matching circuit as claimed in claim 1, wherein the series circuit has a switching transistor having a source potential connected to ground.

19. The impedance matching circuit as claimed in claim 1, wherein the at least one switching element includes at least two switching elements connected in parallel.

20. The impedance matching circuit as claimed in claim 1, further comprising a further series circuit connected in parallel to the series circuit, the further series circuit having a further drive circuit connected thereto.

21. The impedance matching circuit as claimed in claim 20, wherein capacitances provided in the series circuits have different values.

22. A plasma supply system comprising a radiofrequency power generator, a load in the form of a plasma process operated at radiofrequency for coating or etching a substrate, and an impedance matching circuit as claimed in claim 1.

23. A plasma supply system comprising a radiofrequency power generator, a load in the form of a plasma process operated at RF for coating or etching a substrate, and an impedance matching arrangement, which has a plurality of impedance matching circuits as claimed in claim 1.

* * * * *